Figure 1:
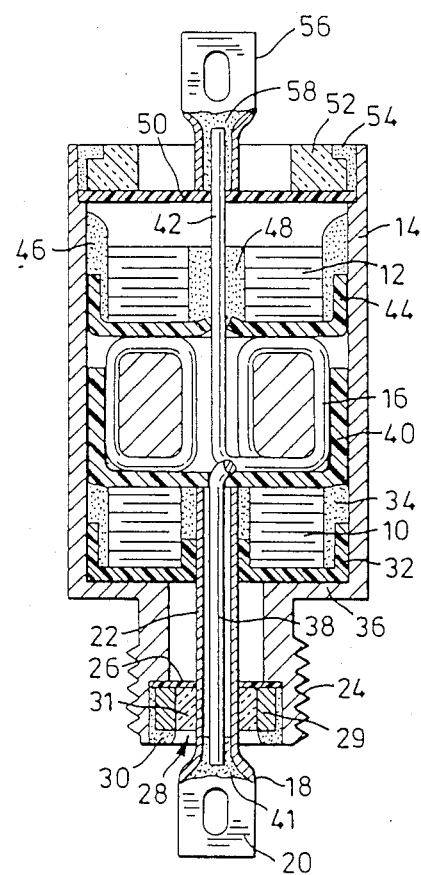

United States Patent [19]

Blamire et al.

[11] Patent Number: 4,673,900

[45] Date of Patent: Jun. 16, 1987

[54] DISCOID CAPACITOR STRUCTURE

[75] Inventors: Michael F. Blamire; Peter F. Briscoe, both of Carrying Place; Douglas D. McLeod, Frankford; B. Kingsley Doolittle, Trenton, all of Canada; Michael J. Roach, Pleasant Gap, Pa.

[73] Assignee: Murata Erie North America, Ltd., Trenton, Canada

[21] Appl. No.: 727,036

[22] Filed: Apr. 25, 1985

[30] Foreign Application Priority Data

Aug. 14, 1984 [CA] Canada .................................. 460944

[51] Int. Cl.⁴ .......................... H03H 7/01; H01G 7/00
[52] U.S. Cl. .................................. 333/167; 29/25.42; 361/307; 333/181; 333/185
[58] Field of Search .................. 333/12, 167, 181–185; 29/25.42; 228/118; 361/302, 303, 306, 307

[56] References Cited

U.S. PATENT DOCUMENTS 2,782,381 2/1957 Dyke ..................................... 333/182
3,076,947 2/1963 Davidson, Jr. ...................... 333/181

*Primary Examiner*—Paul Gensler
*Attorney, Agent, or Firm*—Rogers & Scott

[57] ABSTRACT

The invention provides a novel attachment for a discoid capacitor and the like to the inside of a tubular casing and to a central lead. An electrically insulating sealing element is positioned below the capacitor during assembly vertically into the casing. The element fits closely about the lead and is deformed into contact with the wall of the housing about the capacitor. The element thus forms a dam to contain solder and flux used to couple the capacitor to the lead and to the casing from above the capacitor so that the solder and flux cannot pass by the capacitor into undesirable locations below the capacitor.

7 Claims, 1 Drawing Figure

DISCOID CAPACITOR STRUCTURE

This invention relates to capacitive filters and particularly to such filters which include an inductive element and which are referred to generally as electromagnetic interference or low pass filters.

The invention will be described with particular reference to one form of filter having capacitive capability as well as an inductive element. Such a filter is known as an electromagnetic interference (EMI) or low pass filter. These filters are built in numerous forms and one particular form which utilizes this invention is known as a "discoid" type because the capacitor contained in the device is built from a series of discs having centre openings in a sandwich arrangement with capacitor leaves between the discs. Alternate leaves are coupled to the outside periphery of the capacitor and the other leaves are coupled to the inner surface formed by the centre openings. Commonly such filters have a housing containing one or more of these capacitors and there are often two with an inductance coil positioned between the capacitors. Electrically the inner surface of the capacitor is connected to a center lead whereas the outer surface is connected to the casing, both connections being made by soldering. Because the casing contains two capacitors and an inductance coil, the soldering has to be done accurately to avoid flow into spaces where solder or flux would have a damaging effect on the performance of the filter.

Discoid capacitors are connected electrically by soldering to the casing and to the central lead. This requires the operator to use sufficient solder and flux to ensure good connections, but not too much or loose solder balls or runs of solder or flux inside the structure can result. It is also a problem in the art that coils used for the inductance element fit loosely in the casing and have to be supported to avoid vibration problems. These problems result in a relatively expensive manufacturing technique designed to minimize the possibility of failure. Such techniques are labour intensive and consequently the cost of manufacture is controlled to some extent by the need for such labour.

It is an object of the present invention to provide a capacitive filter using a discoid capacitor which minimizes the likelihood of stray solder or flux finding its way into unwanted spaces and which is not dependent on accurate tolerancing of the casing and components positioned within the casing.

Accordingly, in one of its aspects, the invention provides a novel attachment for a discoid capacitor and the like to the inside of a tubular casing and to a central lead. An electrically insulating sealing element is positioned below the capacitor during assembly vertically into the casing. The element fits closely about the lead and is deformed into contact with the wall of the housing about the capacitor. The element thus forms a dam to contain solder and flux used to couple the capacitor to the lead and to the casing from above the capacitor so that the solder and flux cannot pass by the capacitor into undesirable locations below the capacitor.

In another of its aspects, the invention provides a method of assembling a discoid capacitor and the like inside a tubular casing.

These and other aspects of the invention will be better understood with reference to the following description taken in combination with the drawing in which:

FIG. 1 is a sectional side view of an exemplary EMI filter incorporating a preferred embodiment of the invention.

Reference is made to FIG. 1 which is to some extent schematic to simplify the problems of illustrating a device which is typically in the order of about 1.5 inches in overall length. Various forms of cross-hatching have been used in order to visually separate the parts and some parts. It should also be noted that the soldering mentioned in the following description is typically of 62% tin, 36% lead and 2% silver unless it is described as high temperature solder, in which case it is typically 10% tin, 88% lead and 2% silver.

As seen in FIG. 1, a pair of discoid capacitors 10, 12 are contained in a casing 14 and spaced axially about an inductance coil 16. The casing and other parts receiving solder connections are either of metal material or coated with such material. The arrangement of the details will be better understood with reference to the method of assembly which will now be described.

A first terminal 18 has a spade end 20 deformed from a tubular shape as an extension of a cylindrical portion 22. This first terminal is first assembled in a hermetic seal 28 having an outer ring 29 of steel plated on its outside to receive solder. This ring is separated by an insulating glass ring 31 which is fused both to the tubular portion 22 of terminal 18 and to ring 31. This fusing causes sealing stresses in the structure as is common in the art. Once this sub-assembly is completed, a Teflon (trade mark) washer 26 is placed inside threaded end portion 24 of the filter and in engagement with a locating shoulder. Next the sub-assembly of the seal 28 and terminal 18 is entered and positioned as shown. It will be seen that there is space between seal 28 and the inner wall of portion 24 to receive solder 30. The casing and ring 31 are treated to receive solder so that once this operation is complete, the terminal is in place. It should be noted that the Teflon washer 26 acts to prevent solder and flux from flowing into the remainder of the structure. It does this by a damming action so that the dense solder cannot come between the hermetic seal and the locating shoulder to float the seal off the shoulder and thereby permit solder and flux to flow past the seal.

Next, the discoid capacitor 10 is positioned over a circular disc of Teflon with an opening in the center. The hole is smaller than the diameter of the cylindrical portion 22 and the outside diameter of the disc is larger than that of the casing 14 sufficient to provide enough material to result in an outer part of the disc becoming generally cylindrical on assembly and extending axially by about one half the thickness of the capacitor. Preferably the surface in contact with the capacitor carries an adhesive so that the capacitor is essentially attached to this disc.

The capacitor is then pushed into the casing from the upper end (as drawn) so that the Teflon disc will become deformed into the shape of the first sealing element 32. It will be seen that this element has an inner portion in close engagement with the cylindrical portion 22, and the aforementioned outer part in engagement with the inner wall of the casing 14. The element 32 acts as a "dam" to prevent the flow of solder 34 which is applied preferably as pre-forms both within the capacitor and outside the capacitor. The preforms are heated to flow into respective spaces between the cylindrical portion 22 and the capacitor and between the capacitor and the inner wall of the casing. The sealing is capable of withstanding the heat of soldering long enough for the solder to melt and then position itself. Consequently, there is little likelihood of solder or flux falling down either through gravity or capillary action past the shoulder 36 formed in the casing to support the capacitor.

Another circular disc is made to be positioned under the inductance coil 16 with a lead 38 from the coil extending through the disc. Next the lead 38 is entered into the casing and moved downwardly to engage within the cylindrical portion 22 of the first terminal 18 and at the same time to deform the Teflon disc into the shape shown as element 40. Preferably, the element 40 has some creasing at its periphery and in contact with the inside of the casing caused by a reduction in diameter as it is pushed into this position. This creasing creates in effect a radial cushion to help support the inductance coil 16 within the casing 14. This would tend to minimize the effects of vibration and also is not dependent on accurate tolerancing to take up its position during assembly.

This partially complete filter is then turned over so that high temperature solder can be used to attach the lead 38 to the terminal 18 as shown at 41. Should any solder or flux flow inside cylindrical portion 22, it will be retained by the element 40 and will not flow any further.

At this stage in the assembly, a second lead 42 from the inductance coil 16 projects upwardly out of the casing 14. The second discoid capacitor 12 is assembled in the same way as the first one 10 using a second sealing element 44. Again, solder 46, 48 is used to hold the capacitor in place and to complete the electrical connections to the casing and to the lead 42. It will be seen that the element 44 acts as a dam for molten solder and that it will prevent stray solder or flux falling into the compartment containing the inductance coil 16.

The top end (as drawn) of the casing 14 is closed off using a disc 50 of Teflon and is positioned on an internal shoulder adjacent the upper end of the casing and having a central opening to receive part of the lead 42. A glass hermetic seal 52 similar to that used at the other end is first fused to the second terminal 56 and then placed on the disc 50 and soldered at 54 to the casing. This hermetic seal is stepped at its periphery to provide space for solder at 54 having a flush finish. The assembly is completed by soldering at 58 to the lead 42 using high temperature solder. This soldering operation is contained by the disc 50.

Parts of the exemplary structure described above can be varied within the scope of the invention. For instance the elements 32, 44, and 40, and discs 26, 50 can be of any suitable material having the necessary non-conductive and deformation characteristics and the elements can also be pre-formed. Such pre-forming would of course have to allow some radial deformation inwardly to ensure an adequate seal on the inside of the casing. Such variations are within the scope of the invention as described and claimed.

Instead of solder it will be appreciated that a synthetic plastics material impregnated with a conductor could be used. Such materials are intended to be included by the term "solder" used in this specification.

We claim:

1. A capacitive filter for use in electronic circuitry, the filter comprising:
    a tubular casing;
    a round central lead having ends projecting beyond the casing;
    a discoid capacitor having a central opening through which the lead extends, the capacitor extending radially between a first conductive termination adjacent the lead and a second conductive termination adjacent the casing, and having the first and second ends spaced axially;
    solder attaching said first termination of the capacitor to the lead and said second termination to the casing at said first end of the capacitor; and
    an electrically non-conductive sealing element having a central opening smaller in diameter than the round central lead and extending radially, the element being at said second end of the capacitor and being forced over the lead so that it is deformed about the lead for sealing engagement with the lead about said central opening, the element also being in sealing engagement with the inner wall of the casing and extending towards said first end between the casing and the capacitor so that the solder and flux used to connect the capacitor at said first end is contained at said second end by the sealing element to prevent flow past the capacitor during manufacture.

2. A capacitive filter as claimed in claim 1 in which the sealing element has an adhesive on the surface in contact with the capacitor.

3. An electromagnetic interference filter comprising:
    a tubular casing;
    a round central lead having ends projecting beyond the casing;
    a discoid capacitor having a central opening through which the lead extends, the capacitor extending radially between a first conductive termination adjacent the lead and a second conductive termination adjacent the casing;
    an electrically non-conductive sealing element having a central opening smaller in diameter than the round central lead and extending radially, the element lying between the capacitor and and end of the casing, and being forced over the lead so that it is deformed about the lead for sealing engagement with the lead about said central opening, the element also being in sealing engagement with the inner wall of the casing so that molten solder and flux used to connect said first termination of the capacitor to the lead and said second termination to the casing is contained by the sealing element;
    an inductive element contained in the casing adjacent the capacitor, this element being coupled to the central lead for electrical continuity; and
    an electrically non-conductive separator between the inductive element and the capacitor, the separator including a portion extending axially between the inductive element and the casing to support the inductive element.

4. A filter as claimed in claim 1 in which the sealing element is Teflon.

5. A filter as claimed in claim 3 in which the separator is Teflon.

6. An electromagnetic interference filter for use in electronic circuitry, the filter comprising:
    a cylindrical and tubular casing having first and second ends;
    first and second discoid capacitors spaced axially inside the casing and extending radially, and each of the capacitors having a central opening;

an inductance coil positioned between the capacitors;
round central leads attached to the coil and extending axially one out of each end of the casing, the leads passing one through each of the central openings of the discoid capacitors, and each of the capacitors having a first conductive termination adjacent one of the leads and a second conductive termination adjacent the casing;
a pair of electrically non-conductive sealing elements having central openings smaller in diameter than the round central lead and extending radially, a first of the sealing elements lying between the first discoid capacitor and said first end and having a portion between the first discoid capacitor and the casing and the other sealing element being between the second discoid capacitor and the inductance coil and having a portion between the second discoid capacitor and the casing, whereby during assembly from the second end of the casing, and with the axis of the casing vertical, the sealing elements act as dams to retain solder and flux; and
solder connecting said first terminations to the central leads and said second terminations to the casing.

7. A method of placing a discoid capacitor in a tubular cylindrical casing and attaching a first conductive termination of the capacitor to the casing and a second conductive termination to a central lead, the method comprising the steps:

forming a disc of electrically non-conductive flexible material having a central opening slightly smaller than the diameter of the central lead and an outer diameter larger than the internal diameter of the casing;

placing the capacitor centrally on the disc;

feeding the disc and capacitor over the central lead with the disc leading so that the disc is then deformed locally to form a seal about the lead;

further feeding the disc and capacitor over the lead and into the casing so that an outer portion of the disc is wrapped around the capacitor in tight engagement with the casing so that the disc is then in sealing engagement with the lead and with the casing, a portion of the disc being between the capacitor and the casing; and soldering said first termination to the casing and said second termination to the lead with the disc acting as a dam to retain the molten solder and flux in place thereby preventing flow past the capacitor.

* * * * *